(12) United States Patent
Terasaki et al.

(10) Patent No.: US 6,399,187 B1
(45) Date of Patent: Jun. 4, 2002

(54) METAL-CERAMICS COMPOSITE, HEAT DISSIPATION DEVICE EMPLOYING IT, AND PROCESSES FOR PRODUCING THEM

(75) Inventors: Ryuichi Terasaki; Akira Miyai; Hideki Hirotsuru, all of Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 79 days.

(21) Appl. No.: 09/598,366

(22) Filed: Jun. 21, 2000

(30) Foreign Application Priority Data

Jun. 25, 1999 (JP) .......................................... 11-179695

(51) Int. Cl.⁷ .............................. B32B 5/14; B32B 3/10
(52) U.S. Cl. .................... 428/307.7; 428/131; 428/137; 428/138; 428/901; 428/317.9; 428/319.1
(58) Field of Search ............................. 428/307.7, 131, 428/137, 138, 901, 317.9, 319.1

(56) References Cited

U.S. PATENT DOCUMENTS

| 4,390,220 A | * | 6/1983 | Benasutti | 339/17 CF |
|---|---|---|---|---|
| 4,998,578 A | * | 3/1991 | Dwivedi et al. | 164/6 |
| 5,303,763 A | * | 4/1994 | Aghajanian et al. | 164/97 |
| 5,465,481 A | * | 11/1995 | Romero | 29/840 |
| 5,526,867 A | * | 6/1996 | Keck et al. | 164/97 |
| 5,858,513 A | * | 1/1999 | Jessen | 428/188 |
| 6,003,221 A | * | 12/1999 | Sawtell et al. | 29/527.6 |

* cited by examiner

Primary Examiner—Blaine Copenheaver
Assistant Examiner—Hai Vo
(74) Attorney, Agent, or Firm—Oblon, Spivak, McClelland, Maier & Neustadt, P.C.

(57) ABSTRACT

A metal-ceramics composite comprising a porous inorganic structure and a metal containing aluminum as the main component, infiltrated into the porous inorganic structure, wherein a part of the porous inorganic structure is made of an inorganic fiber and a hardened product of a hydraulic inorganic substance.

13 Claims, No Drawings

METAL-CERAMICS COMPOSITE, HEAT DISSIPATION DEVICE EMPLOYING IT, AND PROCESSES FOR PRODUCING THEM

BACKGROUND OF THE INVENTION

1. Field of the Invention

The present invention relates to a metal-ceramics composite having a reinforcing material combined with a metal containing aluminum as the main component, particularly a metal-ceramics composite excellent in processability. Further, the present invention relates to a heat dissipation device made of a highly thermal-conductive composite which is excellent in thermal conductive characteristics and light in weight and which is useful for a heat sink for semiconductor parts such as ceramic substrates or IC packages.

2. Discussion of Background

Circuit boards for mounting semiconductor elements are known which employ various substrates such as ceramic substrates or resin substrates. In recent years, along with the progress in miniaturization of the circuit boards and in high densification of semiconductor elements, a further improvement is desired in the heat dissipation characteristics of the circuit boards. For a ceramic substrate, an attention has been drawn to e.g. silicon carbide (SiC), aluminum nitride (AlN) or silicon nitride ($Si_3N_4$)

When a ceramic substrate is to be employed as a circuit board or a substrate for a package, it is necessary to dissipate a heat generated from a semiconductor element to the exterior by means of a heat sink provided in contact with the rear side of the substrate and further by means of heat dissipation parts such as heat dissipation fins, to secure performance characteristics of the semiconductor element.

When a commonly employed metal material such as copper (Cu) is used for such a heat sink, cracks, etc. may form on the ceramic substrate under heat cycles during heat bonding or production or during the actual use, due to a difference in thermal expansion between the ceramic substrate and the heat sink. Accordingly, when a ceramic substrate is used in the field where high reliability is required, it has been common to employ e.g. Mo or W having a high melting point and having a small difference in the thermal expansion from the ceramic substrate, as the heat sink.

However, a heat dissipation device employing a high melting point metal such as Mo or W, is heavy as Mo or W is a heavy metal, such being undesirable for applications where light in weight of the heat dissipation device is desired. Further, the above-mentioned heat dissipation device is expensive. Accordingly, in recent years, an attention has been drawn to a metal-ceramics composite (hereinafter referred to simply as a composite) so-called MMC (metal matrix composite) having copper, aluminum or an alloy thereof reinforced with inorganic fibers or particles.

A metal-ceramics composite is a composite which is prepared usually by preliminarily molding inorganic fibers or particles as a reinforcing material, to form a preform and infiltrating a metal or alloy as a base material (matrix) into the fibers or particles of the preform. As the reinforcing material, ceramics of e.g. alumina, silicon carbide, aluminum nitride, silicon nitride, silica or carbon, is employed.

When a metal-ceramics composite is used for the preparation of the above-mentioned heat dissipation device, highly precise plane processing or hole processing is, for example, required, but the composite has had a problem that it is poor in the processability as a ceramics is combined, and the cost for processing tends to be high.

SUMMARY OF THE INVENTION

The present invention has been made in view of the above problem of the metal-ceramics composite, and it is an object of the present invention to provide a metal-ceramics composite to which a usual metal processing method can easily be applied, so that it can be processed inexpensively.

When a metal-ceramics composite is to be practically employed, it may sometimes be fastened to e.g. a heat dissipation fins by means of processed holes, and in such a case, it may happen that the strength of the composite is inadequate in the vicinity of the holes and no adequate fixing or close contact can be accomplished. Accordingly, it is another object of the present invention to provide a metal-ceramics composite having the mechanical properties improved in the vicinity of the holes.

A further object of the present invention is to provide a metal-ceramics composite, whereby cavities can be prevented which are likely to form during the infiltration operation, and formation of recesses on the surface of the hole portions can be prevented thereby to prevent shaping failure such that openings of the holes will not be flat at the time of hole processing.

A still further object of the present invention is to provide a heat dissipation device which is light in weight and excellent in the heat dissipation property and which is suitable for electric parts including ceramic substrates and IC packages, particularly electric parts for mobile instruments such as automobiles and electric railways.

The present inventors have conducted extensive studies to accomplish the above objects and as a result, have found that when a specific material is applied to portions of a composite where processing is required, it is possible to obtain holes which are excellent in processability and which have shaping accuracy improved simply by applying a conventional metal processing method without formation of cavities or recesses therearound, and to obtain a metal-ceramics composite whereby such holes may be employed for bolts without deteriorating mechanical properties. The present invention has been accomplished on the basis of this discovery.

That is, the present invention provides a metal-ceramics composite comprising a porous inorganic structure and a metal containing aluminum as the main component, infiltrated into the porous inorganic structure, wherein a part of the porous inorganic structure is made of an inorganic fiber and a hardened product of a hydraulic inorganic substance.

The present invention provides the above metal-ceramics composite wherein the porous inorganic structure contains silicon carbide as the main component, the above metal-ceramics composite wherein the inorganic fiber is at least one member selected from the group consisting of boron nitride, silicon carbide, alumina, silica, silicon nitride and carbon, and the above metal-ceramics composite wherein the hydraulic inorganic substance is at least one member selected from the group consisting of calcia, alumina, magnesia, alumina cement and Portland cement.

The present invention provides the above metal-ceramics composite wherein the inorganic fiber is alumina, and the hydraulic inorganic substance is alumina, and preferably, the above metal-ceramics composite wherein the porous inorganic structure contains silicon carbide as the main component.

Further, the present invention provides the above metal-ceramics composite wherein the porous inorganic structure is a plate and has holes (through-holes) communicating to both sides of the plate, preferably, the above metal-ceramics composite wherein an inorganic fiber and a hardened product of a hydraulic inorganic substance, is filled in the through-holes of the porous inorganic structure, more preferably, the above metal-ceramics composite wherein the-porous inorganic structure contains silicon carbide as the main component, the inorganic fiber is alumina, and the hydraulic inorganic substance is alumina.

Further, the present invention provides the above metal-ceramics composite wherein a portion of the metal-ceramics composite comprising the inorganic fiber, the hardened product of a-hydraulic inorganic substance and the metal containing aluminum as the main component, is processed to form the through-holes.

Further, the present invention provides a heat dissipation device comprising the above metal-ceramics composite and a nickel layer formed on at least one main surface of the composite.

Still further, the present invention provides a process for producing a metal-ceramics composite, which comprises a step of molding a silicon carbide powder, followed by firing, to obtain a preform, a step of forming through-holes in the preform, filling a slurry having an inorganic fiber and a hydraulic substance dispersed in water, into the through-holes, hardening the hydraulic substance, followed by drying, and a step of infiltrating a metal containing aluminum as the main component, into the preform.

The present invention also provides a process for producing a heat dissipation device, which comprises a step of molding a silicon carbide powder, followed by firing, to obtain a preform, a step of forming through-holes in the preform, filling a slurry having an inorganic fiber and a hydraulic substance dispersed in water, into the through-holes, hardening the hydraulic substance, followed by drying, and a step of infiltrating a metal containing aluminum as the main component, into the preform, to obtain a metal-ceramics composite, and a step of forming a nickel layer on at least one main surface of the metal-ceramics composite thus obtained.

DETAILED DESCRIPTION OF THE PREFERRED EMBODIMENTS

The present invention relates to a metal-ceramics composite having a metal containing aluminum as the main component infiltrated into a porous inorganic structure. The thermal expansion coefficient of a metal-ceramics composite is usually determined by the thermal expansion coefficients of the ceramics as the reinforcing material and the metal infiltrated to constitute the matrix material, and by the composition ratio thereof. Usually, the thermal expansion coefficient of a ceramics is substantially smaller than the thermal expansion coefficient of a metal, and in order to lower the thermal expansion coefficient of a composite, it is effective to increase the composition ratio of the ceramics.

On the other hand, the coefficient of thermal conductivity of the metal-ceramics composite is also basically determined by the coefficients of thermal conductivity of the ceramics as the reinforcing material and the metal as the matrix material, and by the composition ratio thereof. However, in the case of the coefficient of thermal conductivity, the bonding state at the interface between the reinforcing material and the matrix will substantially contribute thereto. Usually, the metal has a high coefficient of thermal conductivity. However, silicon carbide (SiC), aluminum nitride (AlN), boron nitride (BN) or the like has a theoretical coefficient of thermal conductivity (at least 300 W/mK) equal to or higher than the metal and thus is expected to be very prospective as a reinforcing material, from the viewpoint of improvement of the coefficient of thermal conductivity.

However, when a composite is to be practically produced, AlN or BN is expensive, and accordingly, the resulting composite will also be expensive. Further, AlN or BN is likely to be oxidized in air, and when it is formed into a composite, a glass phase having an extremely low coefficient of thermal conductivity is likely to form between the ceramics as the reinforcing material and the metal as the matrix, and accordingly, there will be a problem that the coefficient of thermal conductivity of the resulting composite tends to be low.

When a composite is to be prepared, wettability between the reinforcing material and the metal is important in order to obtain a dense composite. Usually, a dense body of a metal-ceramics composite is prepared by a high pressure casting method wherein a metal to be matrix, is infiltrated under a high temperature high pressure condition into a preform prepared by molding a ceramics as the reinforcing material into a prescribed shape. If the melting. point of the metal to be infiltrated, is high, the temperature during the infiltration will be high, whereby the ceramics is likely to be oxidized, and the ceramics and the metal are likely to react to form a compound having undesirable characteristics. Further, if the melting point of the metal is high, the infiltration temperature will be high, whereby the material for e.g. a mold will be limited and will be expensive, and at the same time, the casting cost itself will increase, and the resulting composite tends to be expensive.

In view of the above situation, the present inventors have conducted various studies on suitable materials for the reinforcing material and as a result, have found it possible to produce a metal-ceramics composite having a high coefficient of thermal conductivity and a low thermal expansion coefficient simultaneously by employing a ceramic structure containing silicon carbide as the main component. The present invention has been accomplished on the basis of this discovery.

Further, the present inventors have conducted various studies also on the metal as the matrix, and as a result have found it possible to produce a good composite without bringing about the above problem, by applying an alloy containing aluminum as the main component to the silicon carbide structure. Namely, the composite of the present invention is preferably one having a metal containing aluminum as the main component infiltrated into a porous body of silicon carbide.

On the other hand, when a metal-ceramics composite is used as a heat dissipating device such as a heat sink, for example, by bonding it to the rear side of a ceramic circuit board, as mentioned above, it is necessary to provide holes (through holes) for bolting, so that the circuit board and the heat sink, as well as the heat sink and the heat dissipating fins are fixed by bolting in order to firmly contact them, respectively.

A ceramics of e.g. silicon carbide is very hard, and for its processing, it will be required to apply a special processing method wherein a special jig such as a diamond drill is employed. Further, a method is known in which a porous inorganic structure having preliminarily provided with holes at desired positions, is employed, and a metal is infiltrated thereto, and the metal in the holes is processed. By this method, a processing method of a metal can be applied, but there is a problem that cavities are likely to form during infiltration, or the metal surface at the hole portion is likely to be recessed usually by about 50 μm, whereby if holes are provided by a metal processing method, the surface in the vicinity of the holes-tend to be lower than other portions (i.e. the shaping accuracy at the holes tends to be poor), and the heat dissipating property tends to be poor in the above-mentioned application to a heat sink. Therefore, a method has been attempted in which a metal is infiltrated into a porous inorganic structure having an inorganic fiber preliminarily filled in the holes, but the above problem has not yet been thereby solved.

The present invention provides a metal-ceramics composite having a metal containing aluminum as the main component infiltrated into a porous inorganic structure, wherein a part of the porous inorganic structure is made of an inorganic fiber and a hardened product of a hydraulic inorganic substance. By using the porous inorganic structure, a part of which is made of an inorganic fiber and a hardened product of a hydraulic inorganic substance, when the metal containing aluminum as the main component is infiltrated, a portion comprising the inorganic fiber, the hardened product of a hydraulic inorganic substance and the metal containing aluminum as the main component, will be formed, and such a portion is rich in processability and can easily be processed by a conventional metal processing method, whereby the above problem will be solved.

In the present invention, the hydraulic inorganic substance is selected for such a reason that when a portion excellent in processability is to be formed at a portion of the porous inorganic structure, for example, if a through-hole is formed in the porous inorganic structure, a hole larger than the final size may be preliminarily formed in the porous inorganic structure, and such a hole may be filled with a slurry having the above-mentioned inorganic fiber and the hydraulic inorganic substance dispersed in water, followed by curing, if necessary by an operation of e.g. drying, whereby a portion excellent in processability can readily be formed with high productivity.

Whereas, if a part of the above-mentioned porous inorganic structure is composed solely of the inorganic fiber, a cavity is likely to form at such a portion of the resulting composite, and a hole obtainable by processing such a portion is likely to be lacking in the shaping accuracy. On the other hand, if the part of the above porous inorganic structure is composed solely of a hardened product of a hydraulic inorganic substance, the processability at the time of processing such a portion, tends to be poor, whereby the object of the present invention tends to be hardly accomplished. Only when the two are combined, the effects of the present invention can be accomplished such that formation of shrinkage cavities during infiltration can be prevented, processing of e.g. holes excellent in shaping accuracy can be carried out, and yet, processing can easily be carried out by a common metal processing method.

According to an experimental study by the present inventors, the ratio of the inorganic fiber and the hardened product of a hydraulic inorganic substance is preferably such that the inorganic fiber is from 1 to 4 vol % and the hardened product of a hydraulic inorganic substance is from 5 to 15 vol %, based on the entire space of the portion comprising the inorganic fiber and the hardened product of a hydraulic inorganic substance, whereby shrinkage during drying after filling in a slurry state, will be little, and accordingly, shaping accuracy in processing will be excellent, and formation of cavities or formation of recesses at the surface of the hole portions at the time of infiltration can be prevented, and it is possible to obtain a metal-ceramics composite which is rich in metal processability and yet scarcely deformed by bolting at the time of practical use.

As the inorganic fiber which can be used in the present invention, carbon, silicon nitride, silica, alumina, silicon carbide or boron nitride may be mentioned. Among them, alumina is preferred, since it will not react even when it is brought in contact with the metal containing aluminum as the main component in a molten state, and it is inexpensive and readily available.

Whereas, the hydraulic inorganic substance which can be used for the present invention, may be one which can be dispersed in water to form a slurry and which, when the water is removed by a means such as drying, can form a hydrate or can form an agglomerate containing the inorganic fiber, which has such a strength not to readily be broken by e.g. vibration, and it may, for example, be calcia, alumina, magnesia, alumina cement or Portland cement. Among them, alumina is preferred, since it will not react even when it is brought in contact with the metal containing aluminum as the main component in a molten state, and it is readily available.

As a method for obtaining a metal-ceramics composite and further a heat dissipation device of the present invention, the following method for producing a silicon carbide-aluminum composite and a heat dissipation device, will be described. However, the present invention is by no means restricted to such a specific example.

The first step for obtaining a silicon carbide-ceramics composite and a heat dissipation device of the present invention, is a step of obtaining a preform. As the silicon carbide powder to be used as the starting material, one excellent in thermal conductivity is preferred, and a green colored silicon carbide powder having a silicon carbide purity of at least 99 mass %, is selected. With respect to the particle size, the maximum particle size may be at most 200 μm, and the packing degree of the powder may be from 60 vol % to 85 vol %. If necessary, two or more types of powders may be mixed to adjust the particle size and to bring the packing degree within the above ranges. If the packing degree is less than 60 vol %, the thermal conductivity of the resulting composite tends to be low, or the thermal expansion coefficient tends to be large, whereby it tends to be difficult to obtain adequate properties as a heat dissipation device for a ceramic circuit board. On the other hand, if it exceeds 85 vol %, when the metal containing aluminum as the main component, is to be infiltrated, the above metal can not adequately be infiltrated even when a high pressure is exerted, and the thermal conductivity of the resulting composite will still be low, or there will be an inconvenience such that the thermal expansion coefficient tends to be large.

The above silicon carbide powder is molded, for example, into a flat plate shape depending upon the particular purpose by a conventional method such as dry press molding, wet press molding, extrusion molding or slip cast molding. However, before it is subjected to such a molding method, a binder may be added which is suitable for the particular molding method. For example, in the case of the wet press molding, an inorganic binder such as silica sol or alumina sol, or an organic binder such as polyvinyl alcohol or methyl cellulose, may be added to the above silicon carbide powder, and further, water, an organic solvent or a surface treating agent may be added, as the case requires, to form a slurry or a paste, which is filled in a mold having a desired shape, followed by press molding. At that time, a pressing force of from 1 to 10 MPa is selected. The molded product obtained by such an operation, may be dried and fired, as the case requires, to obtain a preform having a strength to such an extent that no breakage takes place during infiltration and the shape can be maintained in the subsequent processing step.

In the second step, desired portions of the above preform are processed to provide through-holes, and a slurry comprising an inorganic fiber and a hydraulic substance, is filled in the through-holes, whereupon the hydraulic substance is hardened, followed by drying, to obtain a porous inorganic structure having portions comprising the inorganic fiber and the hardened product of a hydraulic substance. For the processing, a conventional processing method may be employed. However, the above preform is made of silicon carbide having a high hardness, and the material of the blade to be used for the processing is preferably ultra hard.

The third step is a step of infiltrating a metal containing aluminum as the main component, into the porous inorganic structure having portions comprising the inorganic fiber and the hardened product of a hydraulic substance, to obtain a metal-ceramic composite which can readily be processed into a heat dissipation device. Here, as the metal containing aluminum as the main component, ADC12 may, for example, be used, but aluminum containing silicon is preferred for such reasons that the melting point of the alloy is low, and a dense composite can readily be obtained, and the thermal expansion coefficient can be made low. It is further preferred that the above-mentioned aluminum containing silicon further contains from 0.2 to 3 atomic % of magnesium, since the thermal conductivity and strength can further be improved.

With respect to the infiltration method, a high pressure casting method or a die-casting method has been known. In the present invention, any method may be employed, but when an aluminum having the above-mentioned composition is to be employed, a high pressure casting method is preferred for a reason that a dense composite can readily be obtained.

In the fourth step, the portions comprising the inorganic fiber, the hardened product of a hydraulic substance and the metal containing aluminum as the main component, of the metal-ceramics composite obtained by the above steps, are processed to form through-holes. Such portions are rich in processability, as they underwent the preceding steps and thus have a characteristic such that shaping can readily be imparted with high precision.

The fifth step is a step of forming a nickel layer on at least one main surface of the metal-ceramics composite of a flat plate shape having through-holes, obtained via the preceding steps. Through this step, bonding with a ceramic substrate or heat dissipation fins can be carried out by means of a solder, and when a module is thereby formed, a high heat dissipating property can be secured.

As a method for forming such a nickel layer, a usual method such as nickel electrolytic plating or electroless plating may be employed, but an electroless plating method is preferred, since it is inexpensive, and a nickel layer can uniformly be formed on either the silicon carbide or the metal containing aluminum as the main component, present on the composite surface.

Now, the present invention will be described in further detail with reference to Examples and Comparative Examples. However, it should be understood that the present invention is by no means restricted by such specific Examples.

EXAMPLES 1 to 15 and COMPARATIVE EXAMPLES 1 and 2

A silicon carbide powder A (NG-220, manufactured by Taiheiyo Random Co., Ltd., average particle size: 60 $\mu$m), a silicon carbide powder B (GC-1000F, manufactured by Yakushima Denko Co., Ltd., average particle size: 10 $\mu$m) and a silica sol (Snowtex, manufactured by Nissan Chemical Industries, Ltd.) were blended to have a composition as shown in Table 1, followed by mixing by an agitation mixer for 30 minutes, and the mixture was molded into a shape of 100 mm×100 mm×5 mm under a pressure of 7 MPa.

The obtained molded product was heated in the atmospheric air at a temperature of 1,100° C. for 2 hours, to obtain a porous silicon carbide structure (hereinafter referred to as a silicon carbide porous product). With respect to the obtained silicon carbide porous product, through-holes having a diameter of 10 mm were formed at the four corners by means of an ultra hard drill, and various types of slurries comprising an inorganic fiber and a hydraulic inorganic substance, were filled in the through-holes, followed by drying at 105° C. to harden the hydraulic inorganic substance, to fill the through-holes to a volume filling rate as shown in Table 1.

Then, each of such various silicon carbide porous products was preliminarily heated to a temperature of 800° C. in an electric furnace and placed in a pressing mold having a diameter of 350 mm, which was preliminarily heated. Then, a melt of Al-12Si at a temperature of 850° C. was poured into the pressing mold, followed by pressing for 15 minutes under a pressure of 70 MPa to infiltrate the above alloy into the silicon carbide porous product to obtain a silicon carbide complex.

The obtained silicon carbide complex was cooled to room temperature and then taken out. The composite here was a plate form, and the above-mentioned holes having a diameter of 10 mm showed an appearance as if it was a second metal-ceramics composite, as the Al-12Si alloy infiltrated to the portions comprising the inorganic fiber and the hardened product of a hydraulic inorganic substance. At the second composite portions, there was no abnormality such as cavities, and the maximum recess at the holes was not more than 10 $\mu$m, such being good.

With respect to the metal-ceramics composite having such second composite portions, drilling of the hole portions were carried out by means of an ultra hard drill having a diameter of 7 mm to evaluate the processability. Further, it was clamped on an Al plate having a thickness of 25 mm by means of bolts having a diameter of 6 mm under a clamping pressure of 6 MPa to carry out a clamping test, whereby presence or absence of a deformation of the second metal-ceramics composite portions around the holes was visually evaluated, whereby no abnormality was observed with respect to the composites of the present invention.

As Comparative Examples, the conditions were the same as in Examples up to obtaining the silicon carbide porous product, but after forming the through-holes, no slurry was filled (Comparative Example 1), and a slurry of only the silicon carbide fiber was filled so that the filling rate of the silicon carbide fiber at the holes after drying became 0.5 vol %, and the subsequent operation was carried out under the same conditions as in Examples. The results are shown in Table 1 together with the above Examples, whereby formation of cavities was observed, the maximum recess at the holes was as deep as at least 30 $\mu$m, so that the shaping accuracy in drilling was not high, and further, after the clamping test by means of bolts, a deformation was observed around the holes.

TABLE 1

| | Proportion of silicon carbide powder (mass %) | | Materials filled in the holes and the filling rates | | | | Characteristics of the metal-ceramics composite | | |
|---|---|---|---|---|---|---|---|---|---|
| | | | Inorganic fiber | | Hydraulic inorganic substance | | | Recesses at the holes after infiltration ($\mu$m) | Deformation around the holes after bolting |
| | A | B | Name of material | Filling rate (vol %) | Name of material | Filling rate (vol %) | Formation of cavities after infiltration | | |
| Ex. 1 | 25 | 75 | Boron nitride | 1 | Calcia | 5 | Nil | 10 | Nil |
| 2 | 50 | 50 | Silicon carbide | 2 | Alumina | 10 | Nil | 5 | Nil |
| 3 | 75 | 25 | Alumina | 3 | Magnesia | 15 | Nil | 0 | Nil |
| 4 | 50 | 50 | Silica | 4 | Alumina cement | 7 | Nil | 5 | Nil |
| 5 | 50 | 50 | Carbon | 1 | Portland cement | 10 | Nil | 5 | Nil |
| 6 | 30 | 70 | Silicon nitride | 2 | Calcia | 14 | Nil | 0 | Nil |
| 7 | 60 | 40 | Boron nitride | 3 | Alumina | 5 | Nil | 7 | Nil |
| 8 | 40 | 60 | Alumina | 4 | Alumina cement | 10 | Nil | 0 | Nil |
| 9 | 50 | 50 | Silica | 1 | Portland cement | 8 | Nil | 7 | Nil |
| 10 | 30 | 70 | Carbon | 2 | Calcia | 15 | Nil | 0 | Nil |
| 11 | 40 | 60 | Silicon Nitride | 3 | Alumina | 10 | Nil | 5 | Nil |
| 12 | 50 | 50 | Silicon carbide | 4 | Magnesia | 5 | Nil | 6 | Nil |
| 13 | 40 | 60 | Alumina | 4 | Alumina | 15 | Nil | 0 | Nil |
| 14 | 60 | 40 | Alumina | 3 | Alumina | 10 | Nil | 5 | Nil |
| 15 | 50 | 50 | Alumina | 2 | Alumina | 5 | Nil | 10 | Nil |
| Comp. Ex. 1 | 50 | 50 | — | — | — | — | Observed | 50 | Observed |
| Comp. Ex. 2 | 40 | 60 | Silicon carbide | 0.5 | — | — | Observed | 30 | Observed |

EXAMPLE 16

A Ni (nickel) layer having a thickness of 10 $\mu$m was formed on the surface of the metal-ceramics composite obtained in Example 13, by an electroless plating method. Then, the metal-ceramics composite was bolted and fixed to a heat dissipation fin and then fixed by soldering to a copper plate provided on the rear side of a silicon nitride circuit board having semiconductor parts mounted thereon, to form a module. This module was practically used without any particular problem.

The metal-ceramics composite of the present invention is provided with portions rich in the processability at a portion of the composite and thus has a feature that by processing such portions, it is possible to carry out processing for e.g. through-holes with a high shaping accuracy. Accordingly, merely by applying an inexpensive metal processing to a part of the composite, it can be processed into a shape for practical application without impairing the performance such as high thermal conductivity or small thermal expansion coefficient, whereby the industrially applicable range can substantially be expanded. Further, according to the process for the production of the present invention, the metal-ceramics composite having such characteristics, can easily be obtained, and further, a heat dissipation device suitable for application such as a module or a heat sink for a ceramic circuit board excellent in the heat dissipation property.

What is claimed is:

1. A metal-ceramics composite comprising a porous inorganic structure having at least one through-hole, and containing a metal containing aluminum as the main component being infiltrated into the porous inorganic structure, wherein at least one through-hole of the porous inorganic structure is filled with an inorganic fiber and a hardened product of a hydraulic inorganic substance.

2. The metal-ceramics composite according to claim 1, wherein the porous inorganic structure contains silicon carbide as the main component.

3. The metal-ceramics composite according to claim 1, wherein the inorganic fiber is at least one member selected from the group consisting of boron nitride, silicon carbide, alumina, silica, silicon nitride and carbon.

4. The metal-ceramics composite according to claim 1, wherein the hydraulic inorganic substance is at least one member selected from the group consisting of calcia, alumina, magnesia, alumina cement and Portland cement.

5. The metal-ceramics composite according to claim 1, wherein the inorganic fiber is alumina, and the hydraulic inorganic substance is alumina.

6. The metal-ceramics composite according to claim 5, wherein the porous inorganic structure contains silicon carbide as the main component.

7. The metal-ceramics composite according to claim 1, wherein the porous inorganic structure is a plate and has through-holes communicating to both sides of the plate.

8. The metal-ceramics composite according to claim 7, wherein an inorganic fiber and a hardened product of a hydraulic inorganic substance, is filled in the through-holes of the porous inorganic structure.

9. The metal-ceramics composite according to claim 8, wherein the porous inorganic structure contains silicon carbide as the main component, the inorganic fiber is alumina, and the hydraulic inorganic substance is alumina.

10. The metal-ceramics composite according to claim 9, wherein a portion of the metal-ceramics composite comprising the inorganic fiber, the hardened product of a hydraulic inorganic substance and the metal containing aluminum as the main component, is processed to form the through-holes.

11. A heat dissipation device comprising the metal-ceramics composite as defined in claim 10 and a nickel layer formed on at least one main surface of the composite.

12. A process for producing a metal-ceramics composite according to claim 1, which comprises a step of molding a silicon carbide powder, followed by firing, to obtain a preform, a step of forming at least one through-hole in the preform, filling a slurry having an inorganic fiber and a hydraulic substance dispersed in water, into said at least one through-hole, hardening the hydraulic substance, followed by drying, and a step of infiltrating a metal containing aluminum as the main component, into the preform.

13. A process for producing a heat dissipation device according to claim 11, which comprises a step of molding a silicon carbide powder, followed by firing, to obtain a preform, a step of forming at least one through-hole in the preform, filling a slurry having an inorganic fiber and a hydraulic substance dispersed in water, into said at least one through-hole, hardening the hydraulic substance, followed by drying, and a step of infiltrating a metal containing aluminum as the main component, into the preform, to obtain a metal-ceramics composite, and a step of forming a nickel layer on at least one main surface of the metal-ceramics composite thus obtained.

* * * * *